(12) United States Patent
Lee et al.

(10) Patent No.: US 6,743,686 B2
(45) Date of Patent: Jun. 1, 2004

(54) SACRIFICIAL POLYSILICON SIDEWALL PROCESS AND RAPID THERMAL SPIKE ANNEALING FOR ADVANCE CMOS FABRICATION

(75) Inventors: Kam Leung Lee, Putnam Valley, NY (US); Ying Zhang, Yorktown Heights, NY (US); Maheswaran Surendra, Croton-on-Hudson, NY (US); Edmund M. Sikorski, Florida, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/172,262

(22) Filed: Jun. 14, 2002

(65) Prior Publication Data
US 2002/0151145 A1 Oct. 17, 2002

Related U.S. Application Data

(62) Division of application No. 09/736,877, filed on Dec. 14, 2000, now Pat. No. 6,518,136.

(51) Int. Cl.⁷ ............................................. H01L 21/336
(52) U.S. Cl. ....................... 438/303; 438/230; 438/231; 438/305; 438/595; 438/696
(58) Field of Search ................................. 438/230, 231, 438/303, 305, 595, 696

(56) References Cited

U.S. PATENT DOCUMENTS

| | | | | |
|---|---|---|---|---|
| 4,818,714 A | * | 4/1989 | Haskell | 438/231 |
| 5,320,974 A | | 6/1994 | Hori et al. | 437/44 |
| 5,595,919 A | | 1/1997 | Pan | 437/29 |
| 5,668,024 A | | 9/1997 | Tsai et al. | 438/199 |
| 5,874,344 A | | 2/1999 | Thompson et al. | 438/308 |
| 5,877,050 A | | 3/1999 | Gardner et al. | 438/231 |
| 5,899,719 A | | 5/1999 | Hong | 438/289 |
| 6,037,640 A | | 3/2000 | Lee | 257/408 |
| 6,156,629 A | * | 12/2000 | Tao et al. | 438/535 |
| 6,225,229 B1 | | 5/2001 | Huster | 438/696 |
| 6,232,184 B1 | * | 5/2001 | Wang et al. | 438/265 |
| 6,268,253 B1 | | 7/2001 | Yu | 438/303 |
| 6,274,450 B1 | | 8/2001 | Lin et al. | 438/305 |
| 6,303,451 B1 | | 10/2001 | Zhang et al. | 438/301 |
| 6,346,468 B1 | * | 2/2002 | Pradeep et al. | 438/595 |
| 6,380,039 B2 | * | 4/2002 | Badenes et al. | 438/301 |
| 6,403,432 B1 | * | 6/2002 | Yu et al. | 438/296 |
| 2002/0001910 A1 | | 1/2002 | Chen et al. | 438/305 |

FOREIGN PATENT DOCUMENTS

| | | |
|---|---|---|
| JP | 06326123 A | 11/1994 |
| JP | 09055500 A | 2/1997 |
| JP | 09191106 A | 7/1997 |

OTHER PUBLICATIONS

"High Carrier Velocity Reliability of Quarter–Micron SPI (Self–aligned Pocket Implantation) MOSFETs", Hori et al., 1992 IEEE, pp. 28.3.1–28.3.4(4 pages).

"A 0.1–μm CMOS Technology with Tilt–Implanted Punch–through Stopper (TIPS)", Hori, Takashi, pp. 4.3.1.4.3.4(4 pages), 1994 IEEE.

"A 0.1 μm IHLATI (Indium Halo by Large Angle Tilt Implant) nMOSFET for 1.0V Low Power Application", Choi, et al., 1997 IEEE, (2 pages).

* cited by examiner

*Primary Examiner*—Michael Trinh
*Assistant Examiner*—Toniae M. Thomas
(74) *Attorney, Agent, or Firm*—Wan Yee Cheung; Perman & Green, LLP

(57) ABSTRACT

A process for making abrupt, e.g. <20 nm/decade, PN junctions and haloes in, e.g., CMOSFETs having gate lengths of, e.g. <50 nm, uses a mask, e.g., sidewall spacers, during ion implantation of gate, source, and drain regions. The mask is removed after source-drain activation by annealing and source and drain extension regions are then implanted. Then the extension regions are activated. Thereafter halo regions are implanted and activated preferably using spike annealing to prevent their diffusion. The process can also be used to make diodes, bipolar transistors, etc. The activation annealing steps can be combined into a single step near the end of the process.

11 Claims, 2 Drawing Sheets

Figure 1:
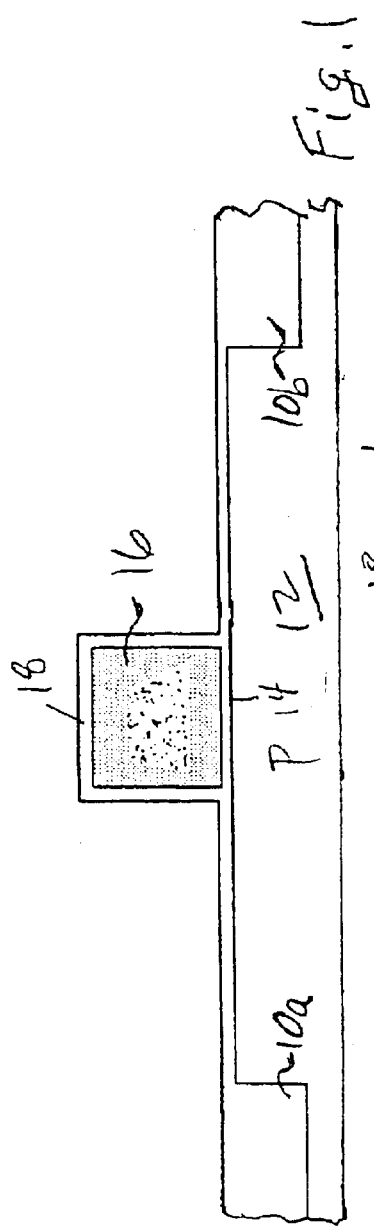

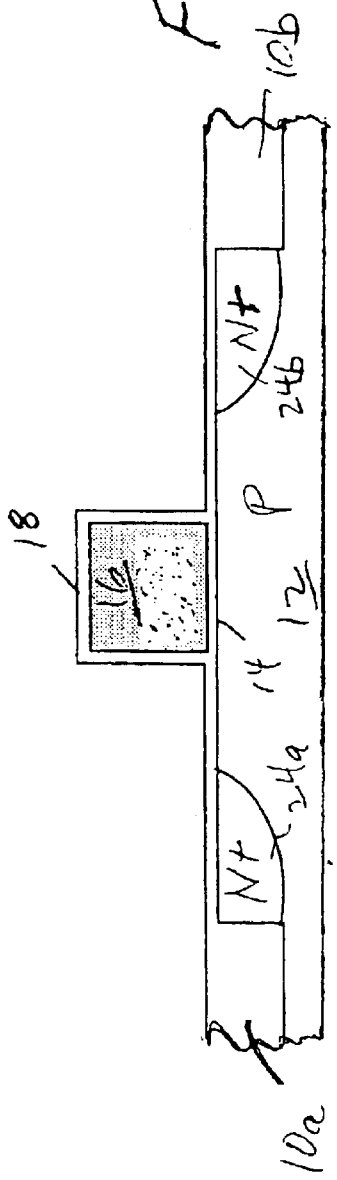
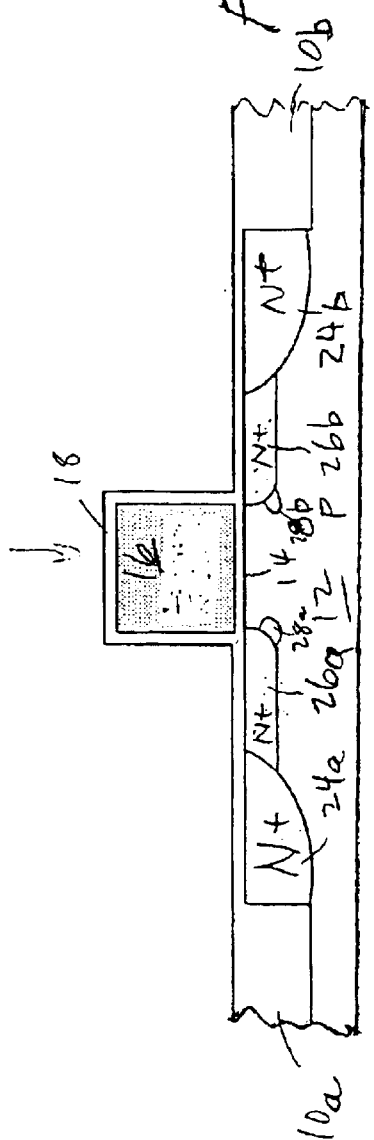
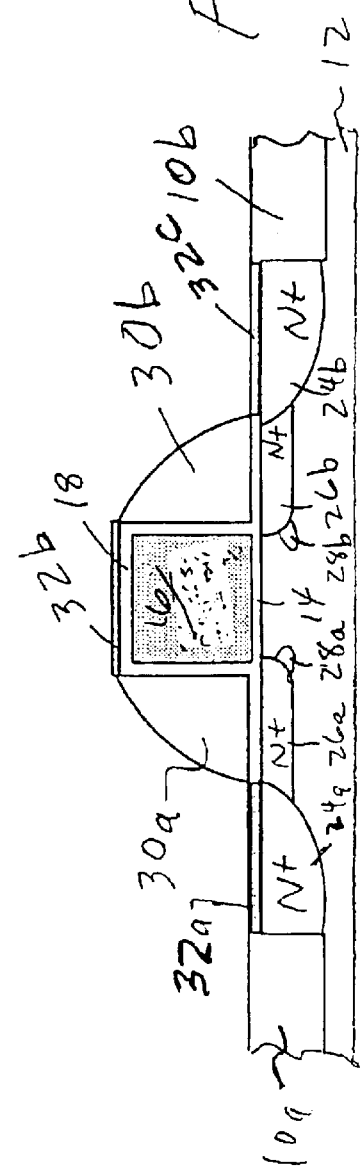

SACRIFICIAL POLYSILICON SIDEWALL PROCESS AND RAPID THERMAL SPIKE ANNEALING FOR ADVANCE CMOS FABRICATION

CROSS-REFERENCES TO RELATED APPLICATIONS

This application is a divisional application of application Ser. No. 09/736,877, filed Dec. 14, 2000, now U.S. Pat. No. 6,518,136, the priority of which is hereby claimed.

STATEMENT REGARDING FEDERALLY SPONSORED RESEARCH OR DEVELOPMENT

Not Applicable

BACKGROUND OF THE INVENTION

1. Field of the Invention

The present invention relates to a method for removing a disposable sidewall, and more particularly, to such a method to make complimentary metal oxide semiconductor field effect transistors (CMOSFETs).

2. Description of the Related Art Including Information Disclosed Under 37 CFR 1.97 and 1.98

As CMOS technology becomes smaller, e.g., less than 50 nm gate length, it becomes more and more difficult to improve the short channel device performance and at the same time maintain acceptable values for off-state leakage current.

One technique for trying to achieve this is the halo technique wherein extra dopant implant regions are next to the sources and drain extension regions. For this to work the junctions must be abrupt, see "CMOS Devices below 0.1 nm: How High Will Performance Go?", by Y. Taur, et al., pp. 1–4. In particular, for sub 50 nm devices, not only the extension regions near the channel must be abrupt, i.e., less than 4 nm/decade, but the halo profile in proximity to the extension junction must be abrupt, i.e., less than 20 nm/decade. Most of the prior art for the halo formation used a general approach wherein halo dopants are implanted at an angle ranging from 0° to 70° into the channel region. This prior art varied either the dose, halo dopants, or angle of halo implants for improving the device performance. The article "Halo Doping Effects in Submicron DI-LDD Device Design" by Christopher Codella et al., pp. 230–233, describes the optimum halo doses for improving the threshold voltage and the punch-through device characteristics. Punch-through stoppers was also discussed in the U.S. Pat. No. 5,320,974 by Atsushi Hori et al. which is similar to the conventional halo arrangements. The article "A 0.1 nm IHLATI (Indium Halo by Large Angle Tilt Implant) MOSFET for 1.0V Low Power Application" by Young Jin Choi et al. described the use of an indium halo and a large angle tilt for indium halo implants for improving the short channel characteristics. Other articles are "High Carrier Velocity and Reliability of Quarter-Micron SPI (Self-Aligned Pocket Implantation) MOSEFETs" by A. Hori et al. and "A 0.1-$\mu$m CMOS Technology with Tilt-Implanted Punchthrough Stopper (TIPS)" by T. Hori. None of the prior art focussed attention on improving the abruptness of the halo dopant profiles in the area next to the channel. In these prior art situations, the halo dopants would have suffered enhanced transient diffusion during extension junction and high thermal budget deep source/dran rapid thermal anneal (typically 1000° C. for 5 seconds). Consequently, these much degraded halos severely compromised their usefulness for improving the short channel device characteristics, and this is especially the case for device channel width below 50 nm. Thus all the prior art approaches provide no means to minimize transient enhanced diffusion of the halo dopants and hence cannot be used to create the abrupt super-halo (<20 nm/decade) in the region next to the channel area.

It is therefore desirable to have a process for making abrupt shallow PN junctions and halos which does not require a large thermal budget allows control of spacer width, easy removal of the spacer and removal of the etch stop layer without damaging the substrate.

BRIEF SUMMARY OF THE INVENTION

A process comprises: forming a mask on a semiconductor substrate; forming at least a first doped area in said semiconductor substrate; removing said mask; forming at least a second doped area in said substrate; and annealing said substrate.

A process comprises: forming an etch stop first layer on a semiconductor substrate; forming a mask second layer on said first layer; accurately and selectively defining said second layer without damaging said first layer; accurately and selectively removing said second layer; and selectively removing said first layer without damaging the substrate.

BRIEF DESCRIPTION OF THE SEVERAL VIEWS OF THE DRAWING(S)

FIGS. 1–6 are crossectional views of the various steps of the invention.

DETAILED DESCRIPTION OF THE INVENTION

As shown in FIG. 1, silicon oxide with a thickness of between about 400 to 1000 nm as an insulating film for separating elements is formed in an element separation shallow trench isolation (STI) region 10a and 10b of a p-type single crystal silicon semiconductor substrate 12. Another silicon oxide film with a thickness of between about 1 to 3 nm as a gate insulating film is formed on an active region of the substrate 12. Then it is etched using known techniques to form the gate insulating layer 14. Then, after depositing a polycrystalline silicon (p-Si) film with a thickness of between about 100 to 150 nm on these silicon oxide films 10 and 14, a gate electrode 16 with a thickness of about 150 nm is formed by etching the deposited polycrystalline silicon film in ordinary photolithography and etching processes. A reoxidation is then done to form layer 18.

Figure 2:

As shown in FIG. 2, a silicon nitride first layer 20 is formed on STI regions 10 and layer 18 with a thickness of between about 10 to 15 nm. Thereafter a nonmonocrystalline, e.g., p-Si, a-Si, etc., second layer on said first layer is formed with a thickness determined by the gate 16 width and the source-to-drain distance. Typically, this thickness is about 150 nm. This second layer is then defined by reactive ion etching (RIE) using a mixture of HBr, $O_2$, and He, wherein the ratio of HBr to $O_2$ is between about 100:1 to 300:1, preferably about 200:1, the ratio of He to $O_2$ is between about 0 to 50 percent, preferably about 25 percent, with a source RF power between about 100 to 300 watts, preferably about 200 watts, a bias power between about 50 to 100 watts, preferably about 75 watts, and a pressure of between about 4–30 mTorr, preferably about 6 mTorr. Such conditions provide the proper amount of directionality, neither too much nor too little, to the etch so that the sidewalls (described below) have the proper shape.

Then this second layer is overetched using reactive ion etching with a mixture of HBr and $O_2$, wherein the ratio of HBr to $O_2$ is between about 25:1 to 100:1, preferably about 50:1, with a source RF power of between about 50 to 150 watts, preferably about 100 watts, a bias RF power of between about 10 to 50 watts, preferably about 25 watts, a time selected to obtain a desired pattern, e.g., less than 10 seconds, and a pressure of between about 4–30 mTorr, preferably about 6 mTorr. The result is a highly selective etch, e.g., p-Si etches at a rate about 200 times faster than $Si_3N_4$, thereby resulting in sidewalls 22a and 22b without damaging layer 20. During these etching steps, layer 20 acts as an etch stop layer.

Figure 3:
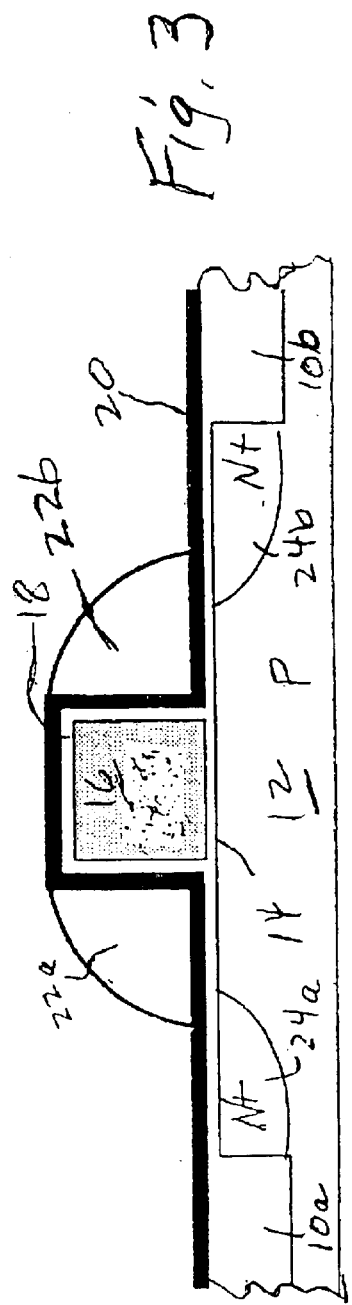

As shown in FIG. 3, arsenic (As) ions are then implanted into the substrate 12 at a dose of between about 5 to $10 \times 10^{15}/cm^2$ at about 50 KeV using the gate electrode 16 and the side wall spacers 22a and 22b as a mask, thereby forming an $N^+$-type deep source contact region 24a and an $N^+$-type deep drain contact region 24b. During this step gate 16 is also ion implanted to make it a good conductor. An optional first annealing between about 1000° C. and 1050° C., preferably about 1000° C., for between about 2 to 5 seconds, preferably about 4 seconds, is done in order to activate regions 24 and gate 16.

Then as shown in FIG. 4, the defined second layer (spacers 22) is removed by first conventional wet etching to remove a thin oxide on the p-Si, and then reactive ion etching using a mixture of HBr, $O_2$ and He, wherein the ratio of HBr to $O_2$ is between about 100:1 to 300:1, preferably about 200:1, the ratio of He to $O_2$ is between about 0 to 50 percent, preferably about 25 percent, with a source RF power between about 100 to 300 watts, preferably about 200 watts, a bias power between about 50 to 100 watts, preferably about 75 watts, and a pressure of about 20 to 60 mTorr, preferably about 30 mTorr, and overetching said second layer using reactive ion etching with a mixture of HBr to $O_2$, wherein the ratio of HBr to $O_2$ is between about 25:1 to 100:1, preferably about 50:1, with a source RF power of between about 50 to 150 watts, preferably about 75 watts, a bias RF power of between about 10 to 50 watts, preferably about 25 watts, a time selected to remove all of said defined second layer and not remove the first layer during said last reactive ion etching step, e.g. less than 150 seconds, and at a pressure of between about 20–60 mTorr, preferably about 30 mTorr. Such etch conditions give a highly selective etch, e.g., p-Si etches at a rate about 300 times faster than $Si_3N_4$. Then the etch stop first layer 20 is removed by hot phosphoric acid at about 160° for between about 6 to 9 minutes.

It will be appreciated that this process allows control of the spacer 22 width for optimum device performance, allows spacer 22 removal whether or not they have been subject to ion implantation and/or annealing, and allows removal of first layer 20 without damaging the shallow junction areas 26 (described below).

As shown in FIG. 5, arsenic (As) ions then are implanted at a dose of 1 to $4 \times 10^{15}$ $cm^{-2}$ at an energy of between about 2 to 10 KeV using the gate electrode 16 as a mask, thereby forming an $N^+$-type source extension region 26a and an $N^+$-type drain extension region 26b. Thereafter a second optional annealing step of between about 1000° C. and 1050° C., preferably about 1000° C., for about 0 to 5 seconds, preferably about 1 second, is done in order to activate extension regions 26.

Then boron (B) is implanted at an energy of between about 3 to 10 KeV at a tilt angle between about 10 to 30 degrees with respect to a normal line of a main surface of substrate 12 and with four rotation around the normal axis and with a total areal dosage of between about $5 \times 10^{13}/cm^2$ to $5 \times 10^{14}/cm^2$ to form halo regions 28a and 28b. The condition of the ion implantation for forming the $P^+$-type halo regions 28 may be adjusted depending upon various factors such as an impurity concentration of the substrate 12, a desired value of the inversion threshold voltage, a minimum gate length and a drain structure. A dosage and a tilt angle of the ion implantation can be selected from a wide range. Boron fluoride ions ($BF_2^+$) and indium ($In^+$) ions are appropriate besides boron ions. Further the shape of halo regions 28 can be other than that shown as known in the art.

Thereafter a spike third optional annealing, e.g., a ramp up rate of greater than about 100° C./s, a hold time of about zero seconds at a target temperature between about 800 to 1050° C., and a ramp down rate greater than about 50° c/s, is performed thus activating the dopants in the haloes 28 and, if said optional first and second annealing steps were not done, also activate regions 24, 26 and gate 16. However, other types of annealing can be used. Further, separate annealing steps can be used for extensions 26 and haloes 28.

Spike annealing can be done by high powered tungsten (W) lamps, arc lamps, or excimer laser operating in the non-melting mode, e.g. less than 075 $J/cm^2$. Spike annealing has two advantages. One is that the wafer can get up to the high target temperature quickly so that the defect annealing with a higher activation energy (~5 eV) can be carried out with less time spent for undesirable halo dopant annealing with less activation energy (<4 eV). The second advantage of the spike anneal is the obvious advantage of much reduced thermal cycle due to the rapid thermal anneal cycle. As a result, the halo dopant motion during rapid thermal annealing is much reduced.

FIG. 6 shows that final sidewall spacers 30a and 30b are formed by a process similar to that used to form initial spacers 22. After depositing a cobalt (Co) film with a thickness of between about 5 to 8 nm on the top surface of the substrate 12 patterned as shown in FIG. 1, a heat treatment at a temperature of between about 500° to 600° C. is conducted to allow the Co film to react with the silicon substrate 12 and the polycrystalline silicon gate electrode 16, to form cobalt monosilicide. A second anneal between about 700 to 750° C. for about 30 seconds is done to convert the cobalt monosilicide to cobalt disilicide films 32a, 32b, and 32c with a thickness of between about 20 to 30 nm. At this step, since the Co film does not react with the silicon oxide film, the Co films on the side wall spacers 30 remain unreacted. This annealing will also activate regions 24, extensions 26, haloes 28, and gate 16, if said optional first, second, and third annealing steps were not done. Then, the unreacted Co films are selectively removed by a wet etching.

As is known in the art, an interlevel insulating film, e.g., BPSG, (not shown) is deposited in an ordinary manner and contact holes reaching the cobalt silicide films 32a and 32c are formed in the interlevel insulating film. Tungsten electrodes (not shown) are then formed in contact with the cobalt silicide films 32a and 32c.

A P-channel type MOS transistor can be produced by first removing the spacers 22 of layer 20 before performing the first annealing step when the conductivity type of each region is reversed.

It will be appreciated that substrate 12 can also be of other group IV material, e.g., C, Ge, etc,; a group III–V material, e.g. GaAs, InP, AlGaAs, etc.; or a group II–VI material. Also for the P-type dopant B, In, Al and Ga can be used, while for the N-type dopant P, As, Sb can be used.

For the conductors Al, Cu, Ti, Ni, heavily doped p-Si or a-Si and combinations thereof can be used.

Further, the present invention can also be used in any device with a PN junction, e.g., diodes, bipolar transistors, etc.

It will be appreciated that the present invention allows activation annealing of the source 24a, drain 24b, gate 16, and extension regions 26 without causing dopant diffusion from haloes 28 since the later have not yet been implanted, i.e., the annealings are decoupled. Also, the high etch selectively allows a greater choice of spacer materials. Further, no additional masking steps are needed.

The order of the steps can also be changed. For example, the shallow extension regions 26 can be implanted and then activated by spike or normal annealing. Then the halo regions 28 are implanted. Thereafter side wall spacers 30 are formed and followed by the deep implantation of source and drain regions 24. Next, a spike or normal annealing is done to activate regions 24. The remaining steps of contact forming, etc. are as described above.

While the present invention has been particularly described with respect to preferred embodiments, it will be understood that the invention is not limited to these particular preferred embodiments, the process steps, the sequence, or the final structures depicted in the drawings. On the contrary, it is intended to cover all alternatives, modifications, and equivalents as may be included within the spirit and scope of the invention defined by the appended claims. In addition, other methods and/or devices may be employed in the method and apparatus of the instant invention as claimed with similar results.

What is claimed is:

1. A process comprising:
    forming an etch stop first layer on a semiconductor substrate;
    forming a mask second layer on said first layer;
    accurately and selectively defining said second layer without damaging said first layer;
    accurately and selectively removing said second layer; and selectively removing said first layer without damaging the substrate, wherein:
        said first layer comprises silicon nitride;
        said second layer is nonmonocrystalline;
        said defining said second layer step includes reactive ion etching using a mixture of HBr, $O_2$ and He, wherein the ratio of HBr to $O_2$ is between about 100:1 to 300:1, the ratio of He to $O_2$ is between about 0 to 50 percent, with a source RF power between about 100 to 300 watts, a bias power between about 50 to 100 watts, and a pressure of between about 4 to 30 mTorr, and overetching said second layer using reactive ion etching with a mixture of HBr and $O_2$, wherein the ratio of HBr to $O_2$ is between about 25:1 to 100:1 with a source RF power of between about 50 to 100 watts, a bias RF power of between about 10 to 50 watts, a time selected to obtain a desired pattern, and a pressure of about 4 to 30 mTorr;
    further comprising forming at least one doped region in said substrate by using the defined second layer as a mask; and
    said removing said defined second layer step includes reactive ion etching using a mixture of HBr, $O_2$ and He wherein the ratio of HBr to $O_2$ is between about 100:1 to 300:1, the ratio of He to $O_2$ is between about 0 to 50 percent, with a source RF power between about 100 to 300 watts, a bias power between about 50 to 100 watts, and a pressure of between about 20 to 60 mTorr, and overetching said second layer using reactive ion etching with a mixture of HBr and $O_2$, wherein the ratio of HBr to $O_2$ is between about 25:1 to 100:1, with a source RF power of between about 50 to 150 watts, a bias RF power of between about 10 to 50 watts, a time selected to remove all of said defined second layer and not remove the first layer during the fourth recited reactive ion etching step, and a pressure of between about 20 to 60 mTorr.

2. The process of claim 1, further comprising forming a gate electrode on said substrate.

3. The process of claim 1, wherein said substrate comprises silicon.

4. The process of claim 3, wherein said second layer comprise p-Si.

5. The process of claim 3, wherein said second layer comprises a-Si.

6. The process of claim 1, wherein said first and third recited reactive ion etching steps have a ratio of HBr to $O_2$ of about 200:1, a ratio of He to $O_2$ of about 25 percent, a source RF power of about 200 watts and a bias RF power of about 75 watts; and
    wherein said second and fourth recited reactive ion etching steps have a ratio of HBr to $O_2$ of about 50:1, a source RF power of about 100 watts, and a bias RF power of about 25 watts; and
    said first and second recited reactive ion etching steps being done at a pressure of about 6 mTorr, and said third and fourth recited reactive ion etching steps being done at a pressure of about 30 mTorr.

7. A process comprising:
    forming an etch stop first layer on a semiconductor substrate;
    forming a mask second layer on said first layer;
    accurately and selectively defining said second layer without damaging said first layer using a mixture of HBr, $O_2$ and He, wherein the ratio of HBr to $O_2$ is between about 100:1 to 300:1 and the ratio of He to $O_2$ is between about 0 to 50 percent;
    accurately and selectively removing said second layer using a mixture of HBr, $O_2$, and He, wherein the ratio of HBr to $O_2$ is between about 100:1 to 300:1, and the ratio of He to $O_2$ is between about 0 to 50 percent; and
    selectively removing said first layer without damaging the substrate.

8. The process of claim 7, further comprising forming a gate electrode on said substrate.

9. The process of claim 7, wherein said substrate comprises silicon.

10. The process of claim 9, wherein said second layer comprises p-S.

11. The process of claim 9, wherein said second layer comprises a-Si.

* * * * *